(12) United States Patent
Vahedi et al.

(10) Patent No.: US 6,316,169 B1
(45) Date of Patent: Nov. 13, 2001

(54) METHODS FOR REDUCING PROFILE VARIATION IN PHOTORESIST TRIMMING

(75) Inventors: Vahid Vahedi, Albany; Yosias Melaku, Berkeley, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/340,070

(22) Filed: Jun. 25, 1999

(51) Int. Cl.[7] ....................................... G03F 7/00
(52) U.S. Cl. .................. 430/329; 430/313; 430/314; 430/324; 216/37; 438/694
(58) Field of Search ................... 430/313, 314, 430/324, 329; 216/37, 46, 63; 438/694

(56) References Cited

U.S. PATENT DOCUMENTS

| | | | |
|---|---|---|---|
| 4,919,748 | * | 4/1990 | Bredbenner .......................... 156/643 |
| 5,766,998 | * | 6/1998 | Tseng .................................. 438/291 |
| 5,895,740 | * | 4/1999 | Chien .................................. 430/313 |
| 5,908,735 | * | 6/1999 | Kim .................................... 430/329 |
| 5,933,759 | * | 8/1999 | Nguyen ............................... 438/700 |
| 5,989,979 | * | 11/1999 | Liu ...................................... 438/439 |
| 6,103,596 | * | 8/2000 | Peng ................................... 438/439 |

* cited by examiner

Primary Examiner—Mark F. Huff
Assistant Examiner—Nicole Barreca
(74) Attorney, Agent, or Firm—Martine & Penilla, LLP

(57) ABSTRACT

A method of removing photoresist material from a semiconductor substrate includes providing a semiconductor substrate having a patterned photoresist mask. A layer comprised of polymer material is formed over the patterned photoresist mask. The layer comprised of polymer material and a portion of the patterned photoresist mask are then removed. The layer comprised of polymer material is preferably formed by introducing a process gas into a plasma environment and is preferably formed with less thickness in a high aspect ratio area relative to a low aspect ratio area.

19 Claims, 5 Drawing Sheets

METHODS FOR REDUCING PROFILE VARIATION IN PHOTORESIST TRIMMING

BACKGROUND OF THE INVENTION

The present invention relates to the process of trimming photoresist material on semiconductor wafers and, more particularly, to trimming a photoresist material while reducing the variation of the critical dimension between photoresist lines and maximizing photoresist budget.

FIG. 1 is a cross-sectional view illustrating several conventional layers of a semiconductor wafer 10. Semiconductor wafer 10 includes a semiconductor substrate 12 formed of, e.g., silicon, that supports intermediate layers 15. Intermediate layers 15 may, for example, include a first layer 14 formed of either a conductive material (e.g. polysilicon) or a dielectric material (e.g. $SiO_2$) depending on the type of device that is being fabricated. Intermediate layers 15 also may include a second layer 16, such as a hard mask layer or an anti-reflective coating (ARC) layer. For ease of illustration, intermediate layers 15 is shown comprising only two layers, but as is well known in the art, more layers may be provided.

During semiconductor wafer processing, features of the semiconductor device are defined in the wafer using well-known patterning and etching processes. Conventionally, a layer of photoresist material 18 is deposited onto semiconductor wafer 10 over intermediate layers 15, and then patterned by a suitable process such as photolithography. In general, the wafer is exposed to light filtered by a reticle, which is a glass plate that is patterned with the desired integrated circuit layer features.

After passing through the reticle, the light impinges upon the surface of the photoresist material. The light changes the chemical composition of the photoresist material such that a developer can be used to remove either the exposed regions (in the case of positive photoresist materials) or the unexposed regions (in the case of negative photoresist materials) of the photoresist material. In the case of positive photoresist materials, the light changes the structure and chemical properties of the photoresist material creating a number of polymerized photoresist sections. These polymerized photoresist sections are then removed using a solvent in a development process leaving a number of photoresist lines. Thereafter, the wafer is etched to remove the material from the areas that are no longer protected by the photoresist material and thereby define the desired features in the wafer.

FIG. 2A is a more detailed view of photoresist layer 18 after it has been patterned into a photoresist mask. In the process described above, the photoresist sections that were polymerized are removed, leaving photoresist lines 18a–d, which protect underlying layers from etching.

One important characteristic of photoresist lines is known as an aspect ratio, which compares the vertical space between lines with the horizontal space. For example, the space between photoresist lines 18a and 18b would have an aspect ratio of approximately 1:2, while the space between photoresist lines 18b and 18c would have an aspect ratio of about 5:2.

Each photoresist line 18a–d has a line width or critical dimension $CD_1$, which determines the width of lines that will be etched in intermediate layers 15. Each photoresist line 18a–d also has a height, which is also known as a resist budget $RB_1$. During the process of etching intermediate layers 15, photoresist lines 18a–d are also etched. Therefore, resist budget $RB_1$, represents the amount of resist that may be consumed by the etching process. For ease of illustration, only four photoresist lines 18a–d are shown, however, as is well known in the art, numerous photoresist lines 18a–d may be formed to produce the desired feature geometries. The feature geometries will in turn enable production of the electrical interconnections intended by the manufacturer, and enable the production of a functioning integrated circuit.

One technique that engineers use to increase the operating speeds of semiconductor devices is by reducing the sizes of conductive lines within the device. Although much improvement has occurred in photolithography systems to enable the fabrication of small features sizes, current lithographic tools are still unable to define feature sizes much below about 0.18 microns. Unfortunately, the costs of developing a photolithography system to define feature sizes below 0.18 microns would be involve the manufacturing of a new tool, and therefore be prohibitively expensive. Therefore, plasma etching has been considered as a method of further reducing the critical dimension $CD_1$, which defines feature sizes, of photoresist lines 18a–d. This technique is called photoresist trimming.

FIG. 2B illustrates patterned photoresist layer 18 during the process of photoresist trimming. After photolithography has been performed, producing photoresist lines 18a–dof, for example, about 0.18 microns, a plasma etch is performed to further reduce the critical dimensions. Photoresist lines 18a–d are bombarded with an etchant flow 20/20', such as oxygen ions, using a low RF bias power to create a plasma. Etchant flow 20' is distinguished from etchant flow 20 to show ions traveling toward the photoresist lines 18a–d at somewhat variable angles.

As shown in FIG. 2B, the degree of exposure that each photoresist line 18a–d has with the ion bombardment varies depending on its proximity to that of other photoresist lines. If a photoresist line is located in an open area, the sidewalls of the photoresist line are in general, fully exposed to angled etchant flow 20'. However, if a photoresist line is located in a dense area, the amount of etchant flow 20' that reaches the lower portions of photoresist sidewalls may be greatly reduced because a large amount of etchant flow 20' is blocked by the neighboring photoresist line.

For example, photoresist line 18a is isolated from other photoresist lines 18b–d. Therefore, photoresist lines 18b–d do not affect the exposure of photoresist line 18a to etchant flow 20'. However, because photoresist line 18c is located in close proximity to photoresist lines 18b and 18d, photoresist lines 18b and 18d block much of etchant flow 20'. For an etchant ion to reach the bottom of the a sidewall of photoresist line 18c, it must either travel towards the sidewall at the perfect angle, or bounce from sidewall to sidewall as shown in FIG. 2B. The amount of etchant flow 20' that reaches the sidewalls of photoresist lines 18b and 18d are likewise reduced by the close proximity of photoresist line 18c.

FIG. 2C illustrates a prior art process of photoresist trimming that has been completed. Because photoresist lines 18b–d are located in a dense area of photoresist lines, the top portions of photoresist lines 18b–d have been consumed much more rapidly by etchant flow 20/20' than the bottom portions. Therefore, the sidewalls of photoresist lines 18b–d show an undesirable tapering effect, as opposed to critical dimension $CD_2$, which is more uniform for photoresist line 18a. An ideal etch operation would leave vertical sidewalls in the surface of semiconductor wafer 10.

Because the top of densely packed photoresist lines 18b–d had a higher horizontal etch or trim rate than the bottom, critical dimension $CD_3$ of photoresist lines 18b–d at the top is less than critical dimension $CD_4$ of photoresist lines 18b–d at the bottom. This variation in critical dimensions $CD_3$ and $CD_4$ may result in errors during etching of the intermediate layers 15 below photoresist layer 18. Such errors may in turn cause inconsistencies in the conductive lines formed during fabrication, therefore adversely effecting the speed and response time of the semiconductor device.

Another problem associated with the technique of photoresist trimming is that etchant flow 20/20' significantly reduces resist budget $RB_1$ of photoresist lines 18a–d shown in FIG. 2A to resist budget $RB_2$ in FIG. 2C. During the etching of intermediate layers 15, photoresist lines 18a–d protect the portions of intermediate layers 15 below, however during the process, the photoresist material itself will be etched away. Therefore, it is important to have an adequate resist depth or budget to ensure that there is enough photoresist material to prevent damage to the layers below. Because photoresist trimming reduces the resist budget of photoresist lines 18a–d, the process increases the chances that the layers below the photoresist material will be damaged due to insufficient resist budget.

Despite the development of photoresist trimming and the growing need for semiconductor devices with very small and conductive lines, a reliable method for preventing the tapering of photoresist lines and preserving photoresist budget is not available. In view of the foregoing, what is needed is a reliable method for trimming photoresist material from photoresist lines in semiconductor wafers while maintaining a consistent critical dimension and maximizing the resist budget of each line.

SUMMARY OF THE INVENTION

The present invention fills this need by providing a method for removing photoresist material from photoresist lines in semiconductor wafers while maintaining a consistent critical dimension and maximizing the resist budget of each line. Several inventive embodiments of the present invention are described below.

In one embodiment of the present invention, a method of removing photoresist material from a semiconductor substrate is provided. In this method, a semiconductor substrate having a patterned photoresist mask is provided. A layer comprised of polymer material is formed over the patterned photoresist mask. The layer comprised of polymer material and a portion of the patterned photoresist mask are then removed. The layer comprised of polymer material is preferably formed by introducing a process gas into a plasma environment.

In another embodiment of the present invention, a method of forming a semiconductor device is provided. In this method, a semiconductor substrate is provided. At least one intermediate layer is formed over the semiconductor substrate, after which a layer comprised of photoresist material is formed over the intermediate layers. The layer comprised of photoresist material is then patterned to form a patterned photoresist mask. A conformal layer of varying thickness comprised of polymer material is formed over then patterned photoresist mask. The layer comprised of polymer material and portions of the patterned photoresist mask are then removed. The layer comprised of polymer material is preferably formed with less thickness in a low aspect ratio area relative to a high aspect ratio area.

In yet another embodiment of the present invention, a method of removing photoresist material from a semiconductor substrate is provided. In this method, a semiconductor substrate having a patterned photoresist mask disposed thereover is provided. A conformal layer of varying thickness comprised of polymer material is formed over the patterned photoresist mask. The layer comprised of polymer material and portions of the patterned photoresist mask are then subjected to plasma etching. The layer comprised of polymer material preferably aids in preserving a resist budget of the patterned photoresist mask during removing the layer comprised of polymer material and portions of the patterned photoresist mask.

The present invention advantageously enables semiconductor devices with interconnections of less than about 0.18 microns wide to be fabricated without damaging such interconnections during the fabrication process. This is important because, as speeds at which the semiconductor devices operate increase, and feature sizes within the semiconductor device decrease, fabrication becomes an even more delicate process. The present invention reduces errors during fabrication, which could lead to a reduction in speed, or even failure of the device.

These and other advantages of the present invention will become apparent to those skilled in the art upon reading the following detailed description of the invention and studying the accompanying drawings.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

The methods of the invention will be described with certain process operations used to define features of a semiconductor device. In particular, patterning and etching operations used to define features of a semiconductor device including the technique of photoresist trimming will be discussed. Those skilled in the art will appreciate that the methods of the invention are not limited to the exemplary structure shown, but instead may be used to facilitate removal of photoresist material in any semiconductor device.

Figure 1:
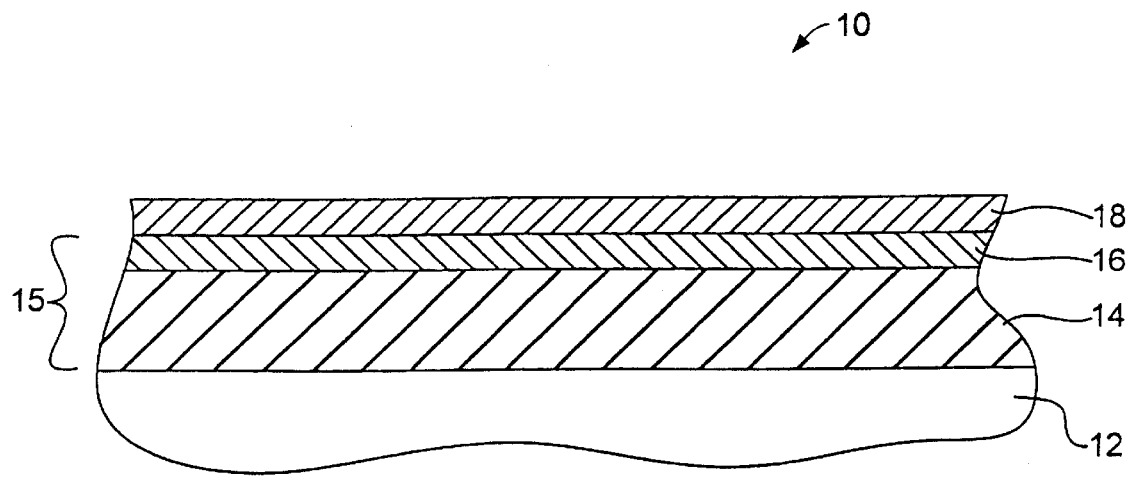
FIG. 1 is a cross-sectional view illustrating several conventional layers of a semiconductor wafer.
Figure 2A:
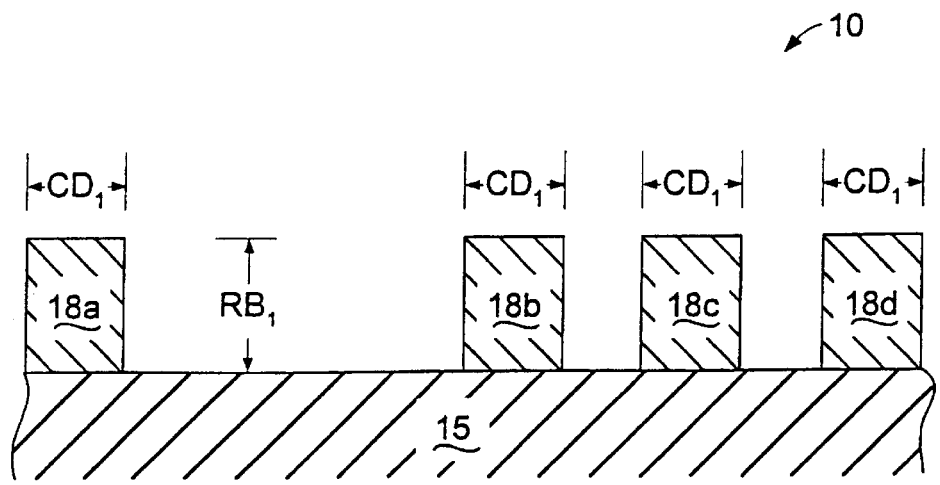
FIG. 2A is a more detailed view of photoresist layer after it has been patterned into a photoresist mask.
Figure 2B:
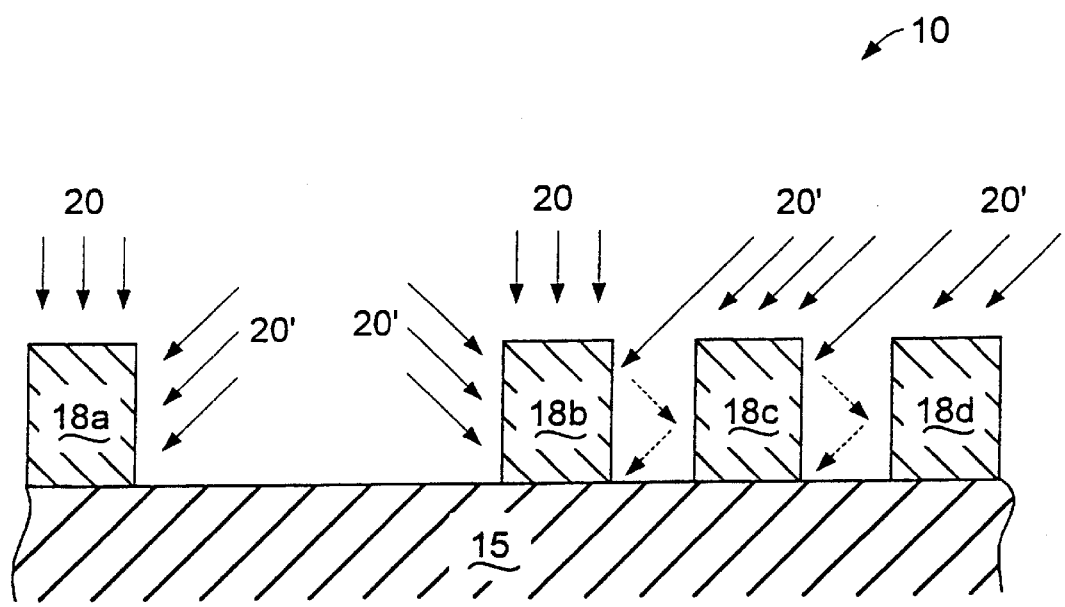
FIG. 2B illustrates patterned photoresist layer during the process of photoresist trimming.
Figure 3A:
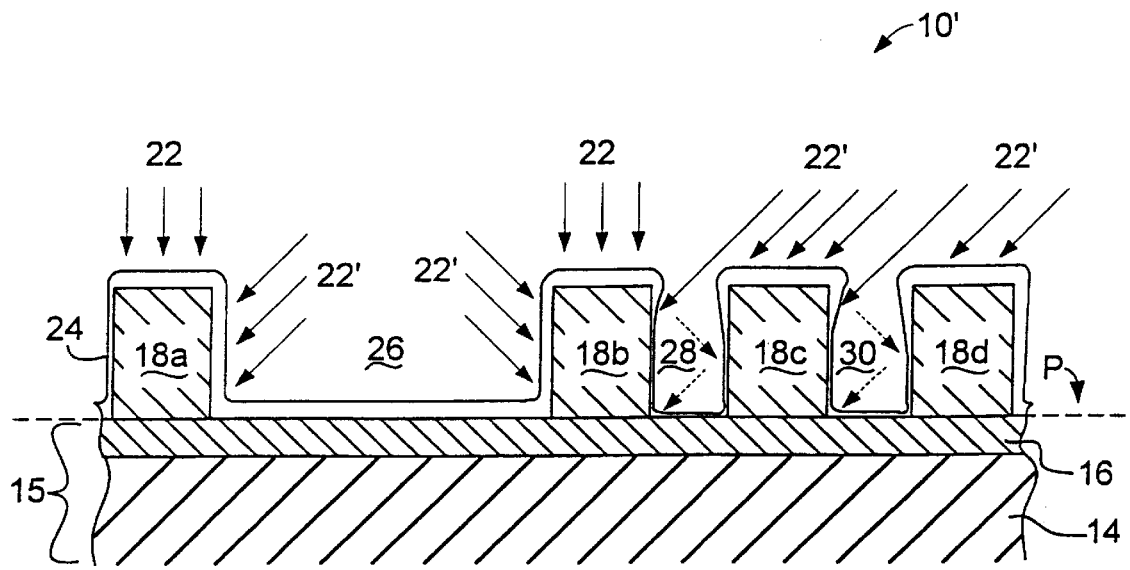
FIG. 3A illustrates a patterned photoresist layer similar to FIG. 2A with the addition of a conformal polymer film in accordance with one embodiment of the present invention.

FIG. 3A illustrates a patterned photoresist layer 18 similar to FIG. 2A with the addition of a conformal polymer film 24 in accordance with one embodiment of the present invention. Photoresist layer 18 has been deposited onto semiconductor wafer 10' over intermediate layers 15, which includes first layer 14 and second layer 16 in accordance with conventional technologies. First layer 14 formed of either a conductive material (e.g. polysilicon) or a dielectric material (e.g. $SiO_2$) depending on the type of device that is being fabricated. Examples of conductive material include polysilicon, doped polysilicon, and aluminum.

Examples of dielectric material include $SiO_2$, $Si_3N_4$, SiON, as well as low dielectric constant materials. As used in connection with the description of the invention, the term "low K material" means any material having a dielectric constant (K) lower than that of $SiO_2$, which has a dielectric constant of about 4.0. Representative low K materials include benzocyclobutene (BCB), FLARE, SiLK, parylene, and polytetrafluoroethylene (PTFE) such as GORE-TEX. SiLK is an organic material produced by Dow Corning Corporation of Midland, Mich. FLARE is an organic spin-on polymer formulated for use as a stand alone, low K interlayer dielectric produced by Allied Signal of Morristown, N.J.

Second layer 16 may include a hard mask layer or an anti-reflective coating (ARC) layer, or both. A hard mask layer, which is typically made from silicon oxynitride (SiON), silicon nitrides ($Si_xN_y$), silicon dioxide ($SiO_2$) or tetraethcoxysilane (TEOS), generally has a thickness in the range from about 1 angstrom to about 5,000 angstroms to provide protection for first layer 14. Those skilled in the art are familiar with suitable techniques for forming hard mask layer.

An ARC layer, which may be made from known organic materials, planarizes the surface of the wafer and aids in the patterning of small images by reducing the amount of light that is scattered. The ARC layer may be formed in accordance with known techniques, e.g., spinning and baking. For ease of illustration, intermediate layers 15 are shown comprising only two layers, but as is well known in the art, more layers may be used to form intermediate layers 15.

Photoresist layer 18 may be made from known photoresist materials, which are typically organic. As is well known to those skilled in the art, the layer of photoresist material 20 is used in the patterning and etching operations to define the desired features of the semiconductor device. Photoresist lines 18a–d are preferably patterned to the smallest critical dimension possible using photolithography, which is about 0.18 microns. However, because an even smaller critical dimension is desired, photoresist lines 18a–d then undergo the process of the present invention.

As shown in FIG. 3A, a deposition flow 22/22' deposit deposition polymers on top of photoresist lines 18a–d and intermediate layers 15, forming a conformal polymer film 24. Deposition flow 22/22' may be created by introducing a suitable process gas to a plasma environment. The gas is decomposed by the plasma and produces polymers, which are similar to photoresist in composition and which provide protection for photoresist lines 18a–d from the plasma etching performed during the process of photoresist trimming.

Hydroflourocarbon plasmas (e.g. $CH_xF_y$ such as $CH_2F_2$ or CHF), flourocarbons (e.g. $CF_x$ such as $CF_4$), and hydrocarbon plasmas, (e.g. $CH_x$ including hydrocarbons such as $CH_4$ or $C_2H_6$) are known to produce polymers with low ion bombardment that result in the deposition of a polymer film 24. For example, a flourocarbon such as $CF_4$ splits into $CF_3$ and F when encountering an electron from an excited plasma environment. Then the $CF_3$ is deposited on top of semiconductor wafer 10' to start forming and building up polymer film 24.

Deposition flow 22' is distinguished from deposition flow 22 by its angle of incidence with respect to semiconductor wafer 10'. That is, deposition flow 22 is substantially normal with respect to the plane of semiconductor wafer 10', while deposition flow 22' is angled with respect to the plane P of semiconductor wafer 10'. FIG. 3A illustrates a the polymer deposition process to show how the locations of each photoresist line 18a–d effects deposition precursor flow 22' and results in essentially uniform polymer film thickness on sidewalls in a low aspect ratio area 26 and non-conformity on sidewalls in high aspect ratio areas 28 and 30 (i.e. in closely spaced lines). However, polymer film 24 may be formed at the same time that a plasma etch is used to trim the photoresist lines 18a–d. Because polymer film 24 has a similar composition to that of photoresist material, it may also be ashed by the same process recipe that ashes photoresist.

The exposure of the surfaces of photoresist lines 18a–d and intermediate layers 15 to deposition flows 22/22' varies depending on the aspect ratio of the space between two photoresist lines. For example, because photoresist line 18a is isolated from other photoresist lines 18, all sides of photoresist line 18a are fully exposed to deposition precursor flow 22'. The same is true for the left sidewall of photoresist line 18b, which is isolated away from photoresist line 18a. Therefore, polymer film 24 forms in an even manner on the right sidewall of photoresist line 18a and the left sidewall of photoresist line 18b. Consequently, low aspect ratio space 26 represents an open area that is fully exposed to deposition precursor flow 22'.

In contrast, high aspect ratio areas 28 and 30 do not have full exposure to deposition precursor flow 22', which results in a tapering effect along the sidewalls of photoresist lines 18b–d that border high aspect ratio areas 28 and 30. Because photoresist line 18c is located in close proximity to photoresist lines 18b and 18d, much of deposition precursor flow 22' is blocked from reaching the lower parts of the sidewalls of high aspect ratio areas 28 and 30 by the neighboring photoresist lines. For deposition precursors to form at the bottom of the sidewalls of high aspect ratio areas 28 and 30, the precursors must either travel towards the sidewall at the perfect angle, or bounce from sidewall to sidewall as shown in FIG. 3A. Therefore, polymer film 24 is much thinner at the bottom of high aspect ratio areas 28 and 30 than it is at other locations.

The aforementioned flourocarbon and hydrogen gases that aid in forming polymer film 24 may be distinguished by their level of "stickiness". A "sticky" deposition precursor increases the thickness of the polymer film on top of photoresist lines and low aspect ratio areas, and decreases thickness in high aspect ratio areas. A less sticky deposition precursor will do the opposite. Typically, when a polymer inducing gas has a higher hydrogen concentration than another, it is stickier. The ability to choose a stickier or a less sticky deposition precursor grants an additional level of control over the etch rate ratios between the top surfaces of the photoresist lines, and regions of the semiconductor wafer in both low and high aspect ratio areas.

Figure 3B:
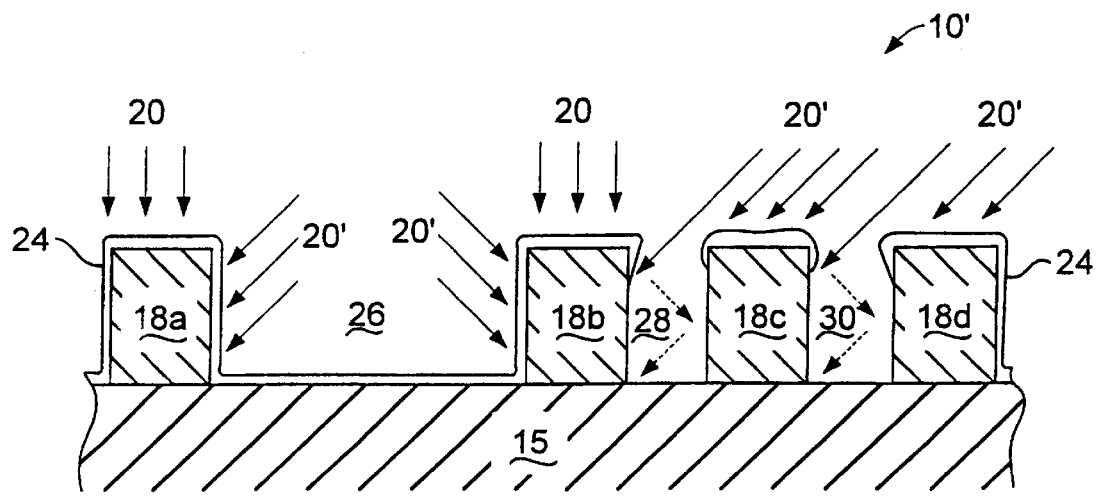
FIG. 3B illustrates the top of semiconductor wafer during the process of photoresist trimming in accordance with one embodiment of the present invention.

FIG. 3B illustrates the top of semiconductor wafer 10' during the process of photoresist trimming in accordance with one embodiment of the present invention. After or during the process of forming polymer film 24, a plasma etch is performed to reduce the critical dimensions of photoresist lines 18a–d. Photoresist lines 18a–d are exposed to an etchant flow 20/20', using a low RF bias power. Etchant flow 20/20' is created by introducing oxygen or nitrogen gas into a plasma environment.

After contacting an electron from the excited plasma, the oxygen or nitrogen molecules break into positive electron ion pairs. The positive ions bombard photoresist lines 18a–d and etch the photoresist due to a negative charge on semiconductor wafer 10'. Etchant flow 20' is distinguished from etchant flow 20 by its angle of incidence with respect to semiconductor wafer 10'. That is, where etchant flow 20 is substantially normal relative to plane P, etchant flow 20' is angled with respect to plane P. Because oxygen and nitrogen ions etch at a very fast rate, it is often useful to add gas additives to limit the rate of etch. Additives such as chlorine or hydrogen bromide control the etch rate by limiting the number of oxygen or nitrogen radicals (positive ions) created within the processing chamber.

The degree of exposure each photoresist line 18 has to the ion bombardment varies depending on its proximity to that of other photoresist lines in the same manner as the exposure photoresist lines 18 had to the deposition precursor flow. If the sidewall of a photoresist line is located in a low aspect ratio area, and it is fully exposed to etchant flow 20'. However, if the sidewall of a photoresist line is located in a high aspect ratio area, the amount of etchant flow 20' that reaches the lower portions of photoresist sidewalls may be greatly reduced because a large amount of etchant flow 20' is blocked by a neighboring photoresist line.

For example, photoresist line 18a is isolated from other photoresist lines 18b–d. Therefore, photoresist lines 18b–d do not have affect the exposure of photoresist line 18a to etchant flow 20'. However, because photoresist line 18c is located in close proximity to photoresist lines 18b and 18d, photoresist lines 18b and 18d block much of etchant flow 20'. For an ion to reach the bottom of the a sidewall of photoresist line 18c, it must either travel towards the sidewall at the perfect angle, or bounce from sidewall to sidewall as shown in FIG. 3B. The amount of etchant flow 20' that reaches the sidewalls of photoresist lines 18b and 18d are likewise reduced by the close proximity of photoresist line 18c.

Polymer film 24 protects photoresist lines 18a–d from plasma etching. Before photoresist lines 18a–d are exposed to etchant flow 20/20', polymer film 24 must be etched away by etchant flow 20/20'. However, because polymer film 24 is thinner at the bottom regions of high aspect ratio areas 28 and 30, it provides less protection for such areas of polymer film 24 during photoresist trimming than for other areas of polymer film 24. For example, because polymer film 24 is much thicker in low aspect ratio area 26 than at the bottom regions of high aspect ratio areas 28 and 30, it will require a greater amount of ion bombardment to etch.

As shown in FIG. 3B, etchant flow 20' has etched away the thinnest portion of polymer film 24 at the bottom regions of high aspect ratio areas 28 and 30, exposing portions of photoresist lines 18b–d. Therefore, the etching of the exposed portions of photoresist lines 18b–d begins before the etching of regions still protected by polymer film 24. However, because so much of etchant flow 20' is blocked from reaching the bottom regions of high aspect ratio areas 28 and 30, the etching of the bottom regions is also much slower than the etching of other regions.

The variable thickness of polymer film 24 provides for a beneficial effect on photoresist lines 18a–d during photoresist trimming. As described above, polymer film 24 is thicker in sidewall regions that have full exposure to etchant flow 20', and thinner in sidewall regions that have reduced exposure to etchant flow 20'. That is, the thickness of polymer film 24 is directly proportional to its exposure to the etchant flow 20'. By depositing polymer film 24 on top of photoresist lines 18a–d, an operator is able to control the etch rate variation between the two regions by adjusting the rate of deposition precursor flow 22/22'. It is preferred that the etching occurs at a slightly faster rate than deposition, therefore the etch to deposition ratio is preferably less than 1:1.

Although, the deposition of a polymer film and the process of photoresist trimming have been illustrated separately in FIGS. 3A and 3B, in a preferred embodiment of the present invention, they occur concurrently. This is accomplished by adding polymer inducing gas additives during etching. The excited plasma environment that splits oxygen or nitrogen molecules into etchant ions also splits flourocarbon and hydrocarbon gases, and forms a deposition precursor. Etch rate variation between different regions of the semiconductor wafer may also be controlled by choosing a specific flourocarbon or hydrocarbon additive that produces a stickier or less sticky deposition precursor.

Figure 2C:
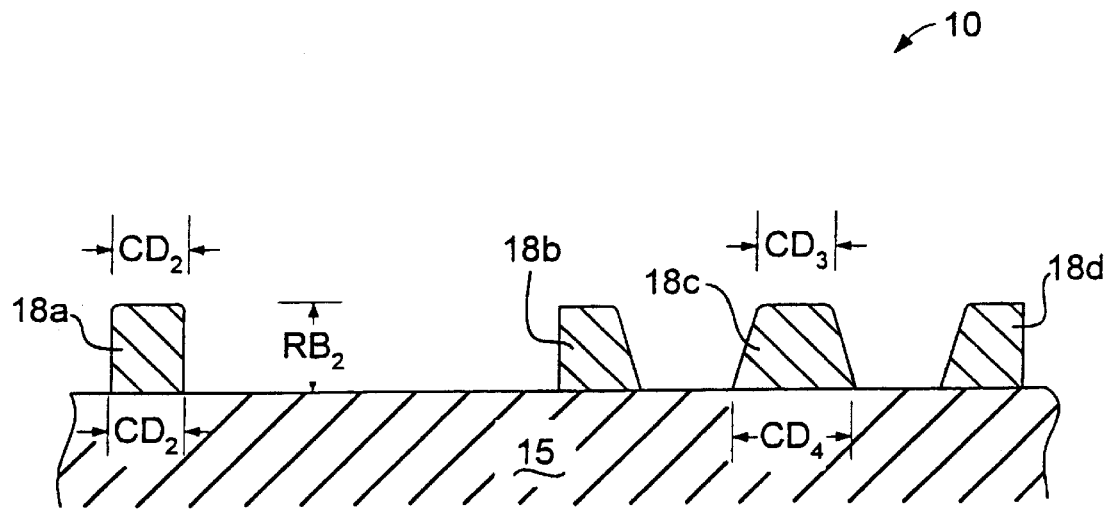
FIG. 2C illustrates a prior art process of photoresist trimming that has been completed.
Figure 3C:
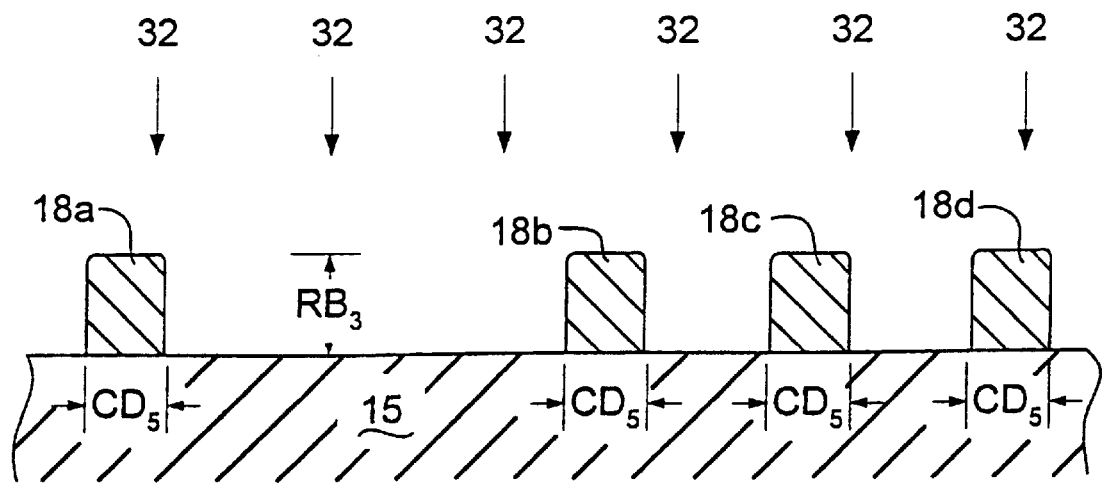
FIG. 3C illustrates the photoresist mask after the process of photoresist trimming has been completed in accordance with one embodiment of the present invention.

FIG. 3C illustrates the photoresist mask after the process of photoresist trimming has been completed in accordance with one embodiment of the present invention. In contrast to the tapered photoresist lines formed by a prior art process (as illustrated in FIG. 2C with critical dimensions $CD_3$ and $CD_4$), photoresist lines 18b–d have an essentially consistent line width from top to bottom. By using the process of the present invention as described above, the critical dimensions $CD_5$ of photoresist lines 18a–d may be trimmed to geometries below 0.18 microns while reducing the errors that result from the fabrication of a semiconductor device from a wafer with tapered photoresist lines. In turn, the fabricated device will allow manufacturers to meet the increasing demands for speed in the industry.

In addition to making photoresist lines with less taper, the present invention may also be used to preserve the resist budget of the photoresist lines. The resist budget is a measurement of the vertical height of the photoresist line, and also a measurement of the level of protection that each photoresist line provides from etching. During the etching of intermediate layers 15 with an intermediate layers etchant 32, photoresist lines 18a–d are also etched, reducing the height of each line. If the resist budget is too low, intermediate layers etchant 32 may undesirably etch intermediate layers 15.

Because the tops of photoresist lines 18a–d are fully exposed to deposition precursor flow 22/22', polymer film 24 is formed at full thickness. Therefore, when photoresist trimming is performed, polymer film 24 not only helps photoresist lines resist tapering, but it also aids in the preservation of resist budget $RB_3$ of each photoresist line 18a–d by slowing the vertical etch rate from etchant flow 20/20', and maximizing the post trim resist thickness. Resist budget $RB_3$ is therefore greater than $RB_2$ (shown in FIG. 2C), and better able to ensure that there is enough photoresist material to prevent damage to the layers below.

Figure 4:
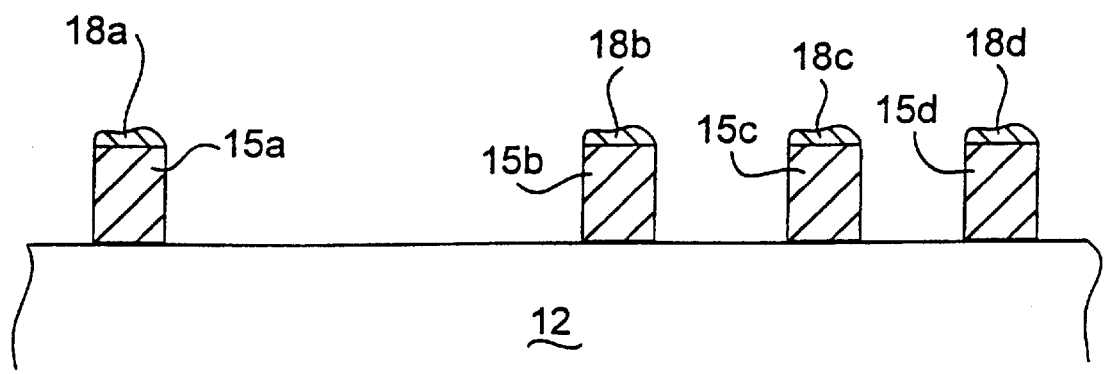
FIG. 4 illustrates semiconductor wafer after the etching of intermediate layers in accordance with one embodiment of the present invention.

FIG. 4 illustrates semiconductor wafer 10' after the etching of intermediate layers 15 in accordance with one embodiment of the present invention. In this exemplary figure, intermediate etchant 32 has etched away large portions of intermediate layers 15, leaving intermediate layers lines 15a–d. As shown, the pattern of trimmed photoresist lines 18a–d has been transferred, forming intermediate layers lines 15a–d, each of which has a line width of less than 0.18 microns. On top of each intermediate layers line 15a–d lies the remnants of photoresist lines 18a–d. As discussed above, the increased budget $RB_3$ of photoresist lines 18a–d aids in ensuring that the portions of intermediate layers 15 below are protected from etching. Photoresist line remnants 18a–d are then removed from semiconductor wafer 10' typically by the use of a stripping solvent.

Figure 5:
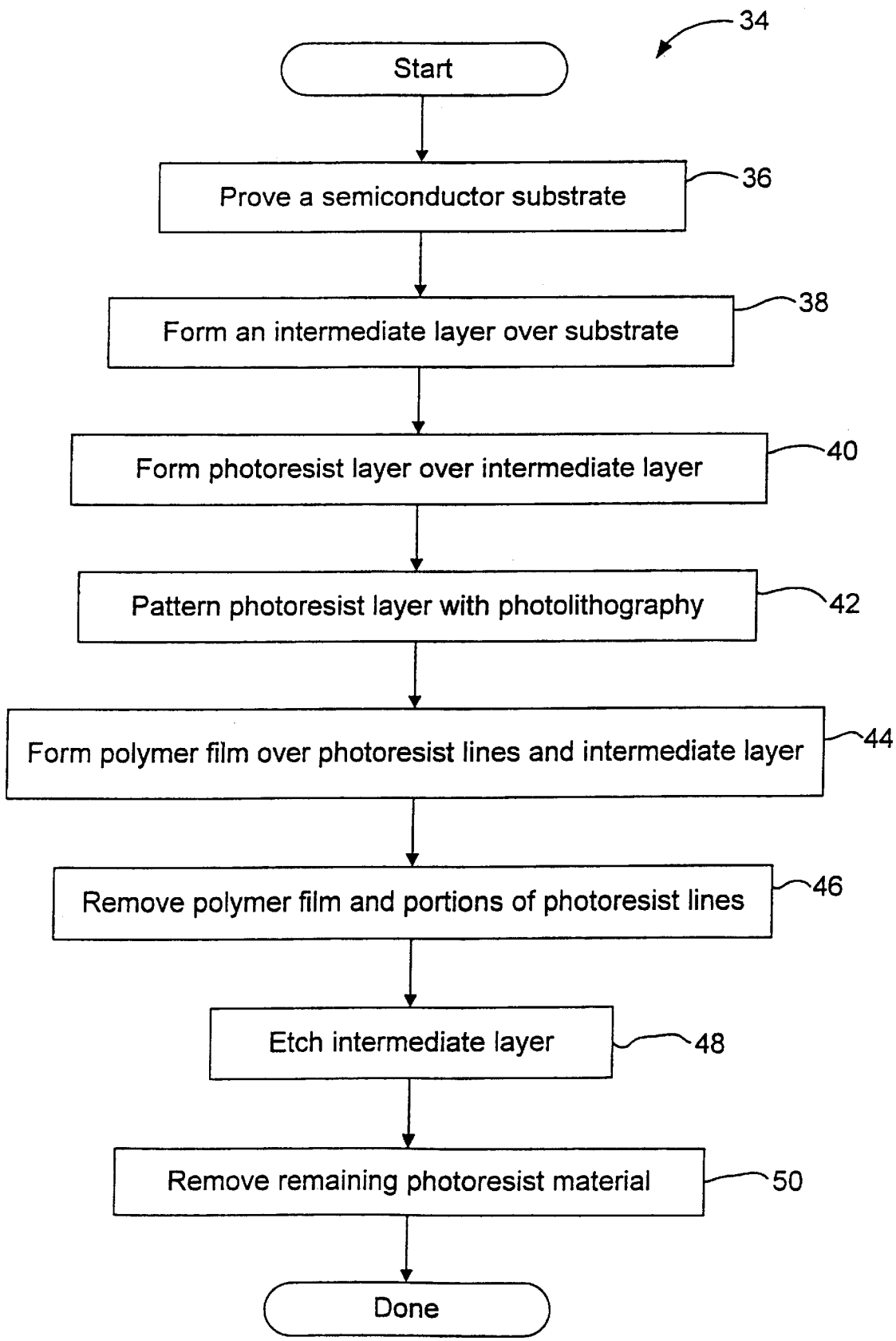
FIG. 5 is a flow chart of a method 34 for reducing profiles variation and preserving resist budget in photoresist trimming.

FIG. 5 is a flow chart of a method 34 for reducing profiles variation and preserving resist budget in photoresist trimming. Method 34 begins with an act 36, which provides a semiconductor substrate for processing. An intermediate layers is then formed over the semiconductor substrate in an act 38. The intermediate layers includes a first layer, which is formed of a conductive material or a dielectric material depending on the type of semiconductor device being fabricated. The intermediate layers may also include a second layer comprising a hard mask layer, a ARC layer, or both.

A layer comprised of photoresist material is then formed over the intermediate layers in an act 40, and patterned using photolithography to form a set of photoresist lines in an act 42. If the desired feature geometries of the semiconductor wafer are below 0.18 microns in size, photolithography will be unable to transfer such a pattern to the photoresist layer. However, in such situations, photolithography is used to transfer the smallest pattern possible, which is about 0.18 microns in size. After photolithography is performed, then the process of photoresist trimming patterns each photoresist line to the correct size.

Method 34 then moves to an act 44, which forms a polymer film over the photoresist lines and the intermediate layers. The polymer film and portions of the photoresist lines are then removed by an etching process that trims the photoresist lines to their desired dimensions. The polymer film is formed preferably by depositing a deposition precursor on the surfaces of the photoresist lines and the intermediate layers during. The deposition precursor may be formed at the same time as the etching process by including a polymer inducing gas additive such as $CH_xF_y$ or $CH_x$ as described above.

An act 46 then removes the polymer film and portions of the photoresist lines by using plasma etching. Because of the presence of the polymer film, the thickness of which may be controlled by varying the stickiness of the deposition precursor of the polymer film, the remaining photoresist lines resist tapering and maximize resist budget. The intermediate layers is etched in an act 48, to form the proper interconnections within a functioning semiconductor device, after which the remaining photoresist material is removed in an act 50.

It will therefore be appreciated that the present invention provides a method of forming very small photoresist lines having a consistent critical dimension from top to bottom, and an adequate resist budget. The photoresist lines are capable of patterning a wafer with feature geometries below 0.18 microns into a semiconductor wafer. The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A method of removing photoresist material from a semiconductor substrate, comprising:
   providing a semiconductor substrate having a patterned photoresist mask;
   forming a layer comprised of polymer material over said patterned photoresist mask wherein the layer comprised of polymer material is formed with less thickness in a high aspect ratio area relative to a low aspect ratio area; and
   removing said layer comprised of polymer material and a portion of said patterned photoresist mask.

2. The method of claim 1, wherein the layer comprised of polymer material is formed by introducing a process gas into a plasma environment.

3. The method of claim 2, wherein the process gas is a flourocarbon gas.

4. The method of claim 2, wherein the process gas is hydrocarbon gas.

5. The method of claim 2, wherein the layer comprised of polymer material and the portion of the patterned photoresist mask are removed by plasma etch.

6. The method of claim 5, wherein the plasma etch includes oxygen ions.

7. The method of claim 5, wherein the plasma etch includes nitrogen ions.

8. A method of forming a semiconductor device, comprising:
   providing a semiconductor substrate;
   forming at least one intermediate layers over said semiconductor substrate;
   forming a photoresist mask over said intermediate layers;
   patterning said photoresist mask to form a patterned photoresist mask;
   forming a conformal layer of varying thickness comprised of polymer material over said patterned photoresist mask wherein the layer comprised of polymer material is formed with less thickness in a high aspect ratio are relative to a low aspect ratio area; and
   removing said layer comprised of polymer material and a portions of said patterned photoresist mask.

9. The method of claim 8, wherein the removing of the layer comprised of polymer material and portions of the patterned photoresist mask occurs at a more rapid rate in a low aspect ratio area relative to a high aspect ratio area.

10. The method of claim 9, wherein the layer comprised of polymer material is formed by introducing a process gas into a plasma environment.

11. The method of claim 10, wherein the process gas includes hydrogen bromide.

12. The method of claim 10, wherein the process gas includes chlorine.

13. A method of forming a semiconductor device, comprising:
   providing a semiconductor substrate;
   forming at least one intermediate layers over said semiconductor substrate;
   forming a photoresist mask over said intermediate layers;
   patterning said photoresist mask to form a patterned photoresist mask;
   forming a conformal layer of varying thickness comprised of polymer material over said patterned photoresist mask, wherein forming said layer comprised of polymer material aids in preserving a resist budget of the patterned photoresist mask during removing the layer comprised of polymer material and portions of the patterned photoresist mask; and removing said layer comprised of polymer material and a portions of said patterned photoresist mask.

14. The method of claim 13, wherein patterning the photoresist mask to form a patterned photoresist mask is accomplished with photolithography.

15. A method of removing photoresist material from a semiconductor substrate, comprising:

providing a semiconductor substrate having a patterned photoresist mask disposed thereover;

forming a conformal layer of varying thickness comprised of polymer material over said patterned photoresist mask, wherein the layer comprised of polymer material is formed with less thickness in a high aspect ratio area relative to a low aspect ratio area; and plasma etching said layer comprised of polymer material and a portions of said patterned photoresist mask.

16. The method of claim 15, wherein plasma etching includes bombarding the layer comprised of polymer material and portions of the patterned photoresist mask with oxygen ions.

17. The method of claim 15, wherein thickness of the layer comprised of polymer material in a high aspect ratio area relative to a low aspect ratio area may be controlled by choosing a deposition precursor according to stickiness.

18. A method of removing photoresist material from a semiconductor substrate, comprising:

providing a semiconductor substrate having a patterned photoresist mask disposed thereover;

forming a conformal layer of varying thickness comprised of polymer material over said patterned photoresist mask, wherein forming said layer comprised of polymer material aids in preserving a resist budget of the patterned photoresist mask during removing the layer comprised of polymer material and portions of the patterned photoresist mask; and plasma etching said layer comprised of polymer material and a portions of said patterned photoresist mask.

19. The method of claim 18, wherein the resist budget of the patterned photoresist mask after removing the layer comprised of polymer material and portions of the patterned photoresist mask may be controlled by choosing a deposition precursor according to stickiness.

* * * * *